United States Patent

Esmael et al.

(10) Patent No.: US 9,793,856 B1
(45) Date of Patent: Oct. 17, 2017

(54) MIXER WITH IMPROVED LINEARITY

(71) Applicant: Analog Devices Global, Hamilton (BM)

(72) Inventors: Mohamed Moussa Ramadan Esmael, Cairo (EG); Mohamed Mobarak, Giza (EG)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/097,983

(22) Filed: Apr. 13, 2016

(51) Int. Cl.
*G06F 7/44* (2006.01)
*H03D 7/14* (2006.01)
*H03H 7/42* (2006.01)

(52) U.S. Cl.
CPC ......... *H03D 7/1408* (2013.01); *H03D 7/1441* (2013.01); *H03H 7/42* (2013.01)

(58) Field of Classification Search
CPC ........ H05B 33/0815; H01L 2924/0002; H01L 2924/00
See application file for complete search history.

(56) References Cited

U.S. PATENT DOCUMENTS

| | | | |
|---|---|---|---|
| 2,693,533 A | 11/1954 | Femmer | |
| 2,962,675 A | 11/1960 | Meyer | |
| 3,939,429 A * | 2/1976 | Lohn | H03B 5/1847 331/100 |
| 4,817,200 A | 3/1989 | Tanbakuchi | |
| 5,060,298 A | 10/1991 | Waugh et al. | |
| 5,361,409 A | 11/1994 | Vice | |
| 6,078,802 A | 6/2000 | Kobayashi | |
| 6,140,849 A | 10/2000 | Trask | |
| 6,810,241 B1 * | 10/2004 | Salib | H03D 9/0633 455/323 |
| 6,895,224 B1 | 5/2005 | Munday et al. | |
| 6,993,312 B1 | 1/2006 | Salib | |
| 7,020,452 B1 | 3/2006 | Kobayashi | |
| 7,031,687 B2 | 4/2006 | Kivekäs et al. | |
| 7,035,616 B2 | 4/2006 | Reynolds | |
| 9,130,508 B1 | 9/2015 | Kang et al. | |

(Continued)

FOREIGN PATENT DOCUMENTS

EP  0232560 B1  10/1990

OTHER PUBLICATIONS

Linear Technology, "Very High Linearity Active Mixer," Datasheet for LT5521, pp. 1-16, dated 2004 (available at: http://cds.linear.com/docs/en/datasheet/5521f.pdf ; accessed: Nov. 4, 2016).

(Continued)

*Primary Examiner* — Sibin Chen
(74) *Attorney, Agent, or Firm* — Knobbe, Martens, Olson & Bear, LLP

(57) ABSTRACT

Mixers with improved linearity are disclosed. A diode or FET ring mixer is implemented with at least one parallel shunt element coupled with the ring mixer, the shunt element providing shunt to a diode or FET, for example, to reduce the effect of nonlinear or off resistance and/or capacitance. Linearity, isolation, symmetry, even order harmonics of the ring mixer, or any combination thereof can be improved as a result. The linearity of the ring mixer with parallel shunt resistors can be further improved by adding series resistors in the ring according to certain embodiments.

20 Claims, 7 Drawing Sheets

(56) References Cited

U.S. PATENT DOCUMENTS

2005/0088204 A1     4/2005   Behzad
2005/0191985 A1     9/2005   Bos et al.
2007/0066269 A1     3/2007   Kivekas et al.
2012/0280742 A1*   11/2012   Chattopadhyay .... H03D 9/0633
                                                               327/355

OTHER PUBLICATIONS

TRASK, "Mixer Musings and the KISS Mixer," Mixer Musings Rev B, Jan. 22, 2012, pp. 1-15, (available at: www.mikrocontroller.net/attachment/146369/Mixer_Musings.pdf; accessed: Nov. 4, 2016).

Franceschino, "An IF Communication Circuit Tutorial," Motorola Semiconductor Application Information, 1996, pp. 1-7 (available at: http://www.nxp.com/files/if_if/doc/app_note/AN1539.pdf; accessed: Nov. 4, 2016).

Rashtian, "On the Use of Body Biasing to Improve the Performance of CMOS RF Front-End Building Blocks," Thesis Submitted in Partial Fulfillment of the Requirements for the Degree of Doctor of Philosophy in Electrical and Computer Engineering at the University of British Columbia, Jul. 2013, pp. 1-198 (available at: https://open.library.ubc.ca/media/download/pdf/24/1.0074003/1/1582; accessed: Nov. 4, 2016).

Rubiola, "Tutorial on the double balanced mixer," Feb. 2, 2008, pp. 1-52 (available at: https://arxiv.org/pdf/physics/0608211.pdf; accessed: Nov. 4, 2016).

TRASK, "A Linearized Active Mixer," Proceedings of the RF Design '98 Conference, San Jose, California, Oct. 1998, pp. 13-24 (available at: http://home.earthlink.net/~christrask/RFDES98.pdf; accessed: Nov. 4, 2016).

Niknejad, "Current/Voltage Commutating Mixers," 2015, pp. 1-50, U.C. Berkeley, California (available at: http://rfic.eecs.berkeley.edu/142/pdf/lect22_iv_mixers.pdf; accessed: Nov. 4, 2016).

* cited by examiner

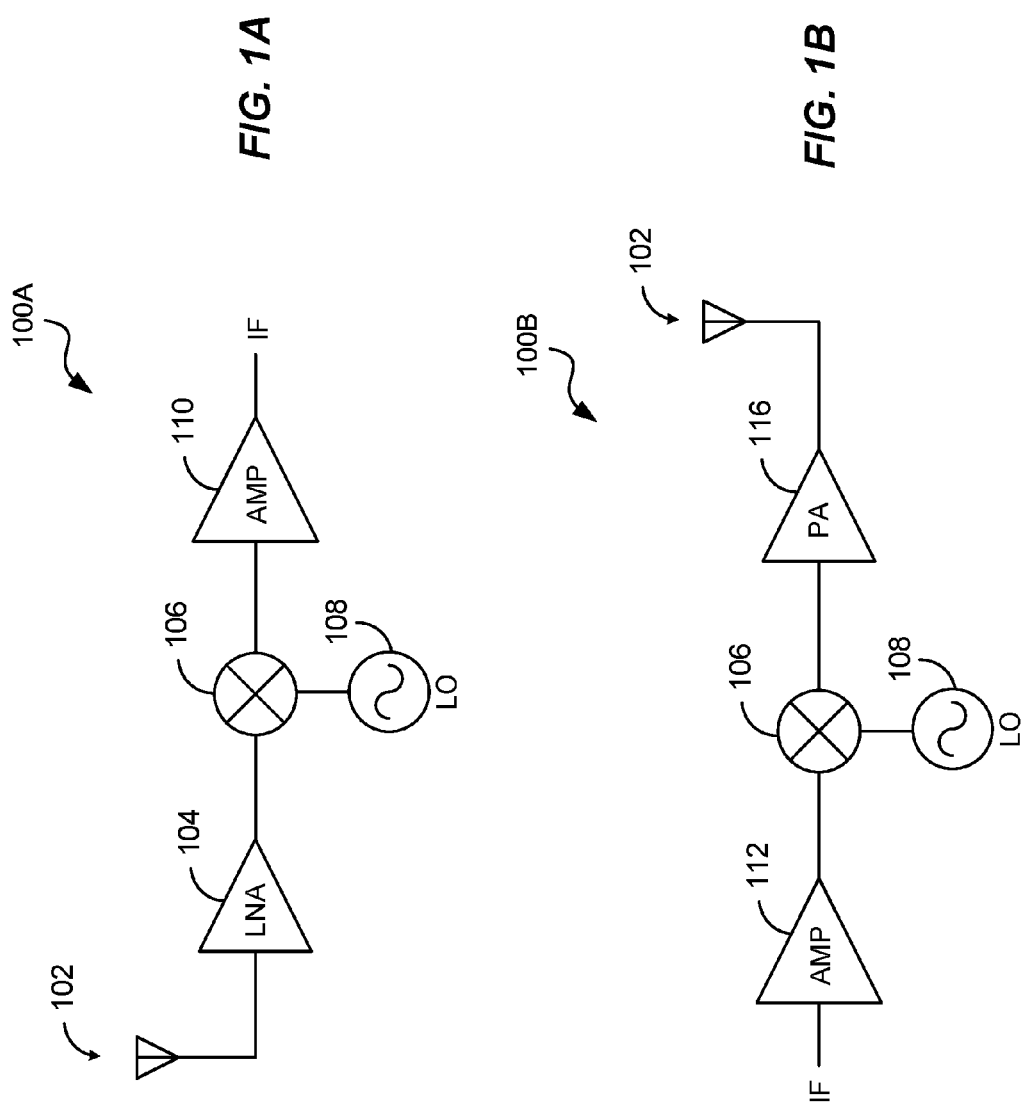

MIXER WITH IMPROVED LINEARITY

BACKGROUND

Technical Field

The described technology generated relates to electronics, more specifically, to mixers.

Description of the Related Art

Mixers are often used in various circuits such as radio frequency (RF) receivers and transmitters for functions such as down converting or up converting. Generally, for mixers, such as diode ring mixer or field effect transistor (FET) ring mixers, linearity is a significant characteristic that affects, for example, cross modulation, desensitization, harmonic generation, gain compression, and degradation in the signal-to-noise and distortion ratio (SNDR). Due to various inherent non-linear characteristics of mixer elements, such as diodes or transistors, and various other design considerations and trade-offs in mixer design, improving linearity of a mixer can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one embodiment, a mixer includes a plurality of switching circuit elements arranged in a ring, and at least one shunt circuit element coupled between two nodes of at least one of the switching circuit elements arranged in the ring, wherein the plurality of switching circuit elements are switched on and switched off based at least in part on a local oscillator signal received by the switching circuit elements, and wherein the mixer is configured to mix an input signal with the local oscillator signal to thereby frequency shift the input signal.

In another embodiment, a mixer includes one or more diodes, and at least one linear circuit element coupled in parallel with a diode of the one or more diodes, wherein the one or more diodes are switched on and switched off based at least in part on a local oscillator signal received by the one or more diodes, and wherein the mixer is configured to mix an input signal with the local oscillator signal to thereby frequency shift the input signal.

In another embodiment, a mixer includes diodes arranged in a ring, resistors, each of which is arranged in parallel with a respective diode of the diodes arranged in the ring, a first balun configured to receive a local oscillator signal, the first balun being electrically coupled to a first node between two of the diodes arranged in the ring, a second balun configured to receive an input signal, the second balun being electrically coupled to a second node between one of the two diodes and another of the diodes arranged in the ring, wherein the mixer is configured to mix the input signal with the local oscillator signal to thereby frequency shift the input signal, and wherein the diodes arranged in the ring and the resistors are implemented on a single die.

For purposes of summarizing the disclosure, certain aspects, advantages and novel features of the inventions have been described herein. It is to be understood that not necessarily all such advantages may be achieved in accordance with any particular embodiment. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments of the invention and are not intended to be limiting.

FIG. 1A is a diagram of an example implementation of the technology disclosed herein in a receiver circuit according to one embodiment.

FIG. 1B is a diagram of another example implementation of the technology disclosed herein in a transmitter circuit according to one embodiment.

DETAILED DESCRIPTION OF CERTAIN EMBODIMENTS

Figure 2A:
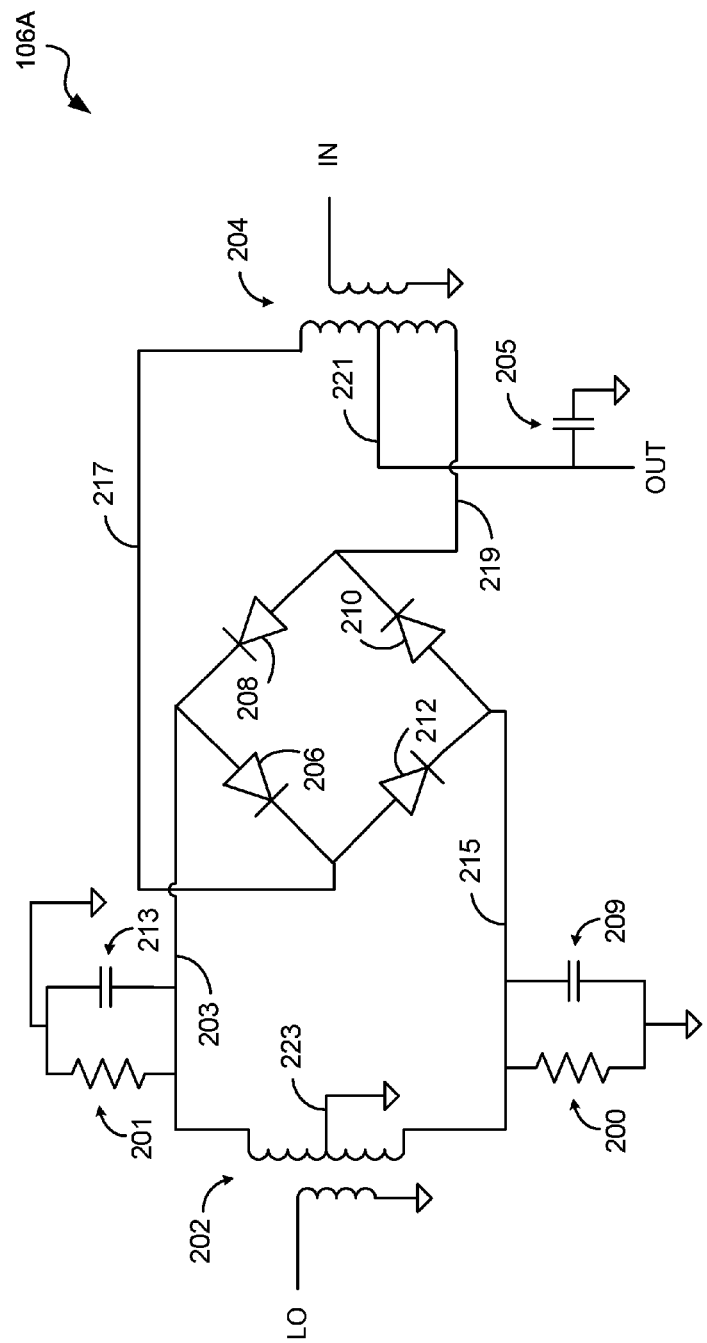
FIG. 2A is a diagram of a mixer according to one embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to any systems and/or devices that could benefit from a mixer with improved linearity. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Mixers implemented with diodes or FETs can suffer from nonlinear resistance and/or capacitance and/or off state nonlinearity. Nonlinearity in mixers can negatively affect mixer performance, harmonic generation, gain compression, and the signal-to-noise and distortion ratio (SNDR). Mixers with improved linearity are disclosed. A diode or FET ring mixer is implemented with parallel resistors in the ring, providing a shunt to each diode or FET in the ring to reduce the effect of nonlinear or off state resistance and/or capacitance. Linearity, isolation, symmetry, even order harmonics, or any combination thereof of the ring mixer can be improved as a result. The linearity of the ring mixer with parallel shunt resistors can be further improved by adding series resistors in the ring.

FIG. 1A is a diagram of an example implementation of the technology disclosed herein in a receiver according to one embodiment. The illustrated receiver 100A includes an antenna 102, a low noise amplifier (LNA) 104, a mixer 106, a local oscillator 108, and an amplifier 110. In certain embodiments, the LNA 104, the mixer 106, and the amplifier 110 can be included on a single integrated circuit. The antenna 102 and/or the local oscillator 108 can be external or internal to the integrated circuit. It will be understood that the receivers and/or the transmitters illustrated in FIGS. 1A-1B may include fewer or more elements than illustrated. In certain implementations, the receivers and/or transmitters disclosed herein can include additional elements or components such as baluns or transformers for providing differential or single-ended signals, intermediate frequency (IF) bandpass filters for filtering out unwanted harmonics, for example. As another example, any of the illustrated antennas can be used for both transmitting RF signals and receiving RF signals and a switch can selectively electrically connect a transmit path or a receive path to such an antenna. As described herein, same or corresponding numerals and/or names of elements in FIGS. 1A-2D and their descriptions indicate the elements having similar or corresponding functionalities and/or characteristics.

The illustrated receiver 100A can receive an RF signal at the antenna 102, and the RF signal can be provided to the LNA 104. An RF signal can have a frequency in the range from about 30 kHz to 300 GHz, such as in a range from about 450 MHz to about 4 GHz for certain communications standards. The LNA 104 can amplify the received RF signal and provide the amplified RF signal to the mixer 106. The local oscillator 110 can provide a local oscillator signal to the mixer 106. In some implementations, the local oscillator 108 can provide a differential local oscillator signal to the mixer 106. The amplifier 110 receives a mixer output from the mixer 106, and the amplifier 112 may output an amplified IF signal for further processing.

The mixers 106 illustrated in FIGS. 1A-2D are single-ended. In some embodiments, the mixers disclosed herein can be implemented as a partially or fully differential mixer receiving differential signal input, differential LO input, and/or producing differential signal output. In some embodiments, the mixers disclosed herein can be implemented with a passive mixer, ring mixer, H-bridge mixer, unbalanced mixer with a single mixing element, double-balanced mixer, and/or Gilbert cell mixer, for example. In some embodiments, the mixers disclosed herein can be implemented with rectifiers or diodes, such as P-N junction diodes, Schottky barrier diodes, GaAs diodes, semiconductor diodes, or the like. In some embodiments, the mixers disclosed herein can be implemented with field effect transistors (FETs), such as metal oxide semiconductor (MOS) transistors, which can be in complementary form, junction field effect transistors (JFETs), laterally diffused metal oxide semiconductor (LDMOS) transistors, GaAs metal semiconductor field effect transistors (GaAs MESFETs), pseudomorphic high electron mobility transistors (pHEMTs), or the like. While the terms "metal" and "oxide" may be present in for example, MOS, such transistor scan have gates made out of materials other than metals, such as polysilicon, and have dielectric oxide regions made from dielectrics other than silicon oxide, such as a high-κ dielectric. According to some other embodiments, mixers implemented in accordance with the principles and advantages discussed herein can be with bipolar transistors, such as SiGe bipolar transistors or GaAs heterojunction bipolar transistors. In some embodiments, the resistors, such as the shunt resistors, disclosed herein can be implemented with linear resistors or any other suitable types of resistors. According to certain embodiments, the resistors can be semiconductor resistors on the same die as the switching circuit elements of the mixer.

FIG. 1B is a diagram of another example implementation of the technology disclosed herein in a transmitter according to one embodiment. The illustrated transmitter 100B includes an amplifier 112, the mixer 106, the local oscillator 108, a power amplifier 116, and the antenna 102. In certain embodiments, the amplifier 112, the mixer 106, and the power amplifier 116 can be included on an integrated circuit. The antenna 102 and the local oscillator 108 can be external to or part of the integrated circuit.

The illustrated transmitter 100B includes the amplifier 112 that receives an IF signal and outputs an amplified IF signal to the mixer 106. The local oscillator 108 can provide a local oscillator signal to the mixer 106. In some implementations, the local oscillator 108 can provide a differential local oscillator signal to the mixer 106. The power amplifier 116 receives a mixer output from the mixer 106, and the power amplifier 116 provides an amplified RF signal to the antenna 102 to be transmitted.

The mixers 106 in the illustrated circuits 100A, 100B in FIGS. 1A-1B can be implemented with example mixers 106A-106D illustrated in and described in connection with FIGS. 2A-2D below. Any suitable combination of the principles and advantages of FIGS. 2A-2D can be implemented in a mixer 106 of FIG. 1A and/or FIG. 1B.

FIG. 2A is a diagram of a mixer according to one embodiment. The illustrated mixer 106A includes diodes 206, 208, 210, and 212 implementing switching circuit elements that form a ring. As described herein, a "ring" mixer generally refers to a mixer having its mixing elements (typically four elements) arranged in a shape of a ring to mix or modulate an input signal with a carrier signal or local oscillator signal to generate an output signal. The mixer elements arranged in a ring are configured to receive and/or produce signals at alternate nodes around the ring (e.g., 203, 217, 215, and 219 in FIGS. 2A-2C and 255, 261, 257, and 259 in FIG. 2D). As discussed herein the ring mixers can be based on diodes or FETs. The mixer ring including the diodes 206, 208, 210, and 212 is coupled to a local oscillator (LO) balun 202 at nodes 203, 215 and an input signal balun 204 at nodes 217, 219 such that the LO signal, LO, and the input signal, IN, are mixed. The mixer 106A provides an output signal, OUT, at node 221 tapped off from the input signal balun 204, which is also coupled to a bypass or decoupling capacitor 205. In some other embodiments, the output signal can be tapped off from the LO balun 202 at node 223. The mixer 106A also includes shunt elements, such as shunt resistors 200, 201, and decoupling capacitors 213, 209 in parallel coupled between the LO balun 202 and ground. The shunt resistors 200, 201 in the mixer 106A are shunt circuit elements or linear circuit elements that, for example, provide shunt to ground reducing leakage from the LO and reduce quality factor of passives. It is to be noted that the illustrated mixer in FIG. 2A, including the shunt resistors 200, 201, can be implemented to incorporate any suitable combination of features of the mixers 106B-106D illustrated in FIGS. 2B-2D below, such as resistors 214, 216, 218, 220 and/or resistors 207, 209, 211, 213.

Figure 2B:
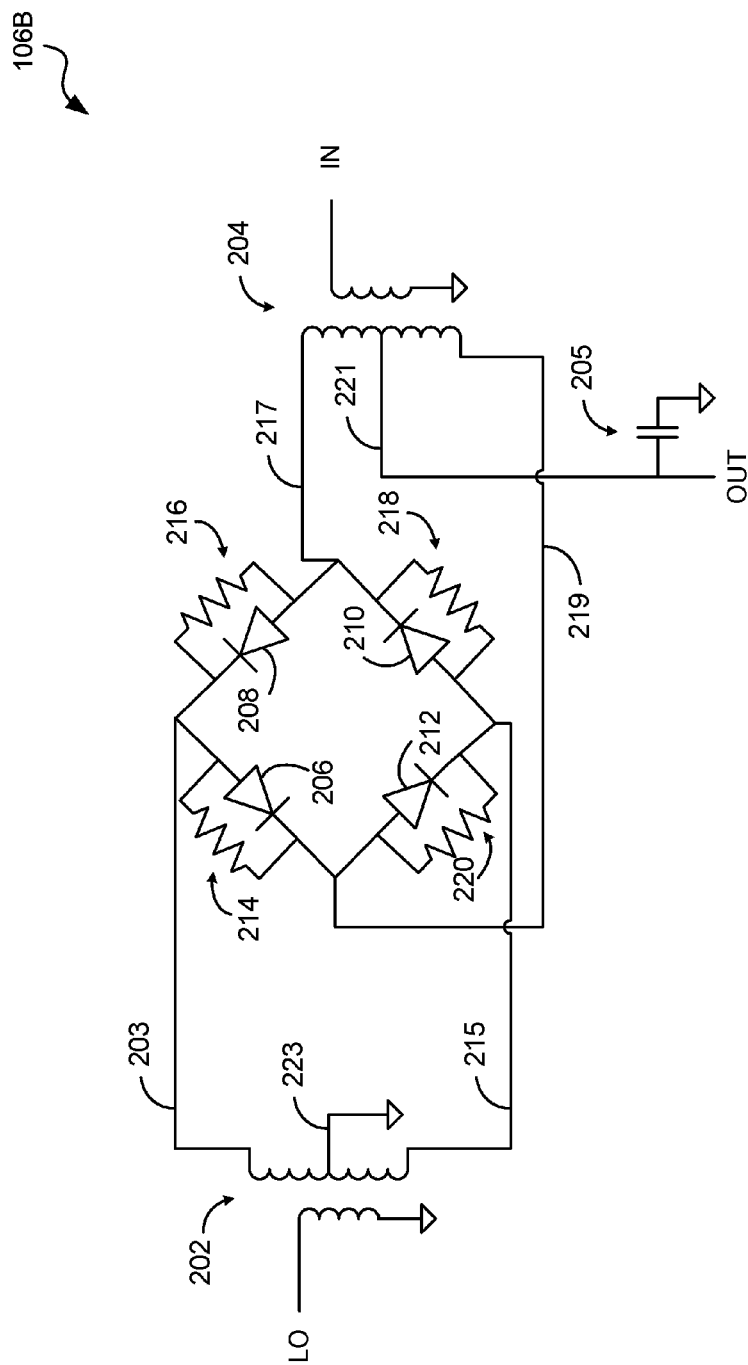
FIG. 2B is a diagram of a mixer according to another embodiment.
Figure 2C:
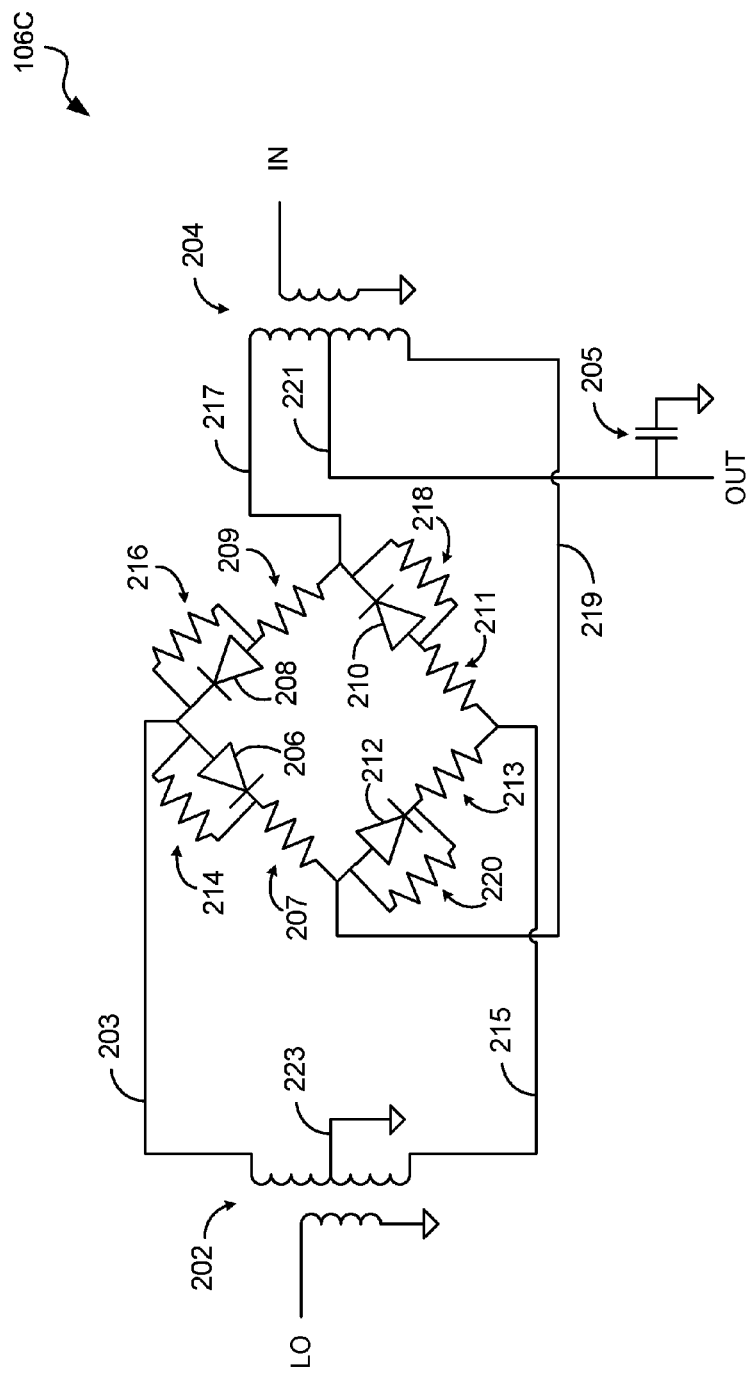
FIG. 2C is a diagram of a mixer according to another embodiment.

In diode ring mixers, such as the illustrated mixers 106A-106C in FIGS. 2A-2C, respectively, each diode 206, 208, 210, and 212 can be forward biased, or "on," or reverse biased, or, "off," depending on the differential LO signals at the nodes 203, 215 and the differential input signals at the nodes 217, 219 of the diode ring. As such, the diodes 206, 208, 210, and 212 can be periodically switched on and off so that the differential input signals from the input signal balun 204 are alternatingly routed to the output node 221 as controlled by the LO signal, LO, producing the output signal, OUT. The resulting output signal, OUT, is effectively the input signal, IN, multiplied by the LO signal, LO. It is to be noted that the mixers 106A-106C can be partially or fully differential. In such implementations, any one of the LO signal, LO, the input signal, IN, and the output signal, OUT, can be differential signals with the mixer having differential input nodes for one or both the baluns 202, 204 and/or the differential output signal tapped off from both of the baluns 202, 204 at the nodes 223, 221 instead of one of them.

FIG. 2B is a diagram of a mixer according to another embodiment. The illustrated mixer 106B includes the diodes 206, 208, 210, and 212 implementing switching circuit elements that form a ring, and the diodes 206, 208, 210, and 212 are respectively coupled to shunt resistors 214, 216, 218, and 220 in parallel or between the two opposing nodes of each of the diodes 206, 208, 210, and 212. The shunt resistors 214, 216, 218, and 212 as shown in FIG. 2B are shunt circuit elements or linear circuit elements that are explicit resistors rather than parasitic resistors.

In the illustrated mixer 106B, the shunt resistors 214, 216, 218, and 220 that are coupled in parallel to signal path allows, for example, reduction in quality factor (Q), or "de-Q"ing, of the nonlinear capacitance of the respective diodes 206, 208, 210, and 212. As high Q of circuits or elements, such as the diodes 206, 208, 210, and 212, signifies high resonance, "de-Q"ing of the diodes 206, 208, 210, and 212 with the shunt resistors 214, 216, 218, and 220 in this example reduces resonance effects and improves linearity. It is to be noted that there is a trade-off between improving linearity of the diodes 206, 208, 210, and 212 by adding the shunt resistors 214, 216, 218, and 220 and conversion loss. And the value of the shunt resistors 214, 216, 218, and 220 can be selected based on the desired amount of reduction in Q, acceptable level of conversion loss, suitable values of on-state resistance $R_{ON}$ and/or off-state capacitance $C_{OFF}$ of the diodes 206, 208, 210, and 212, a tradeoff between linearity and conversion loss, or any combination thereof. For example, higher resistance values for the shunt resistors 214, 216, 218, and 220 improves conversion loss but reduces the improvement in linearity. It can be advantageous to implement a mixer with improved linearity as disclosed herein since the disclosed mixers can improve mixer balance and isolation, diode core symmetry, even order harmonics, or any combination thereof. Various performance metrics related to linearity can be improved as discussed below in connection with FIGS. 3-4.

FIG. 2C is a diagram of a mixer according to another embodiment. The illustrated mixer 106C includes the shunt resistors 214, 216, 218, and 220 coupled in parallel with the respective diodes 206, 208, 210, and 212, and the mixer 106C further includes series resistors 207, 209, 211, and 213, or linear circuit elements, respectively coupled in series to the diodes 206, 208, 210, and 212 in their respective segments of the diode ring between the nodes 219, 203, the nodes 203, 217, the nodes 217, 215, and the nodes 215, 203, respectively. The shunt resistors 214, 216, 218, and 220 in the illustrated mixer 106C operate based on similar principles and provide similar advantages discussed above in connection with FIG. 2B. In the illustrated mixer 106C, the series resistors 207, 209, 211, and 213 coupled in series in the signal path in addition to the parallel shunt resistors 214, 216, 218, and 220 can further improve linearity of the mixer 106C. In some embodiments, the resistance of the shunt resistors 214, 216, 218, and 220 can be about three orders of magnitude higher than the resistance of the series resistors 207, 209, 211, and 213. For example, in some implementations, the resistance of the series resistors 207, 209, 211, and 213 can be in the order of 1Ω while the resistance of the shunt resistors 214, 216, 218, and 220 can be in the order of 1 kΩ.

Figure 2D:
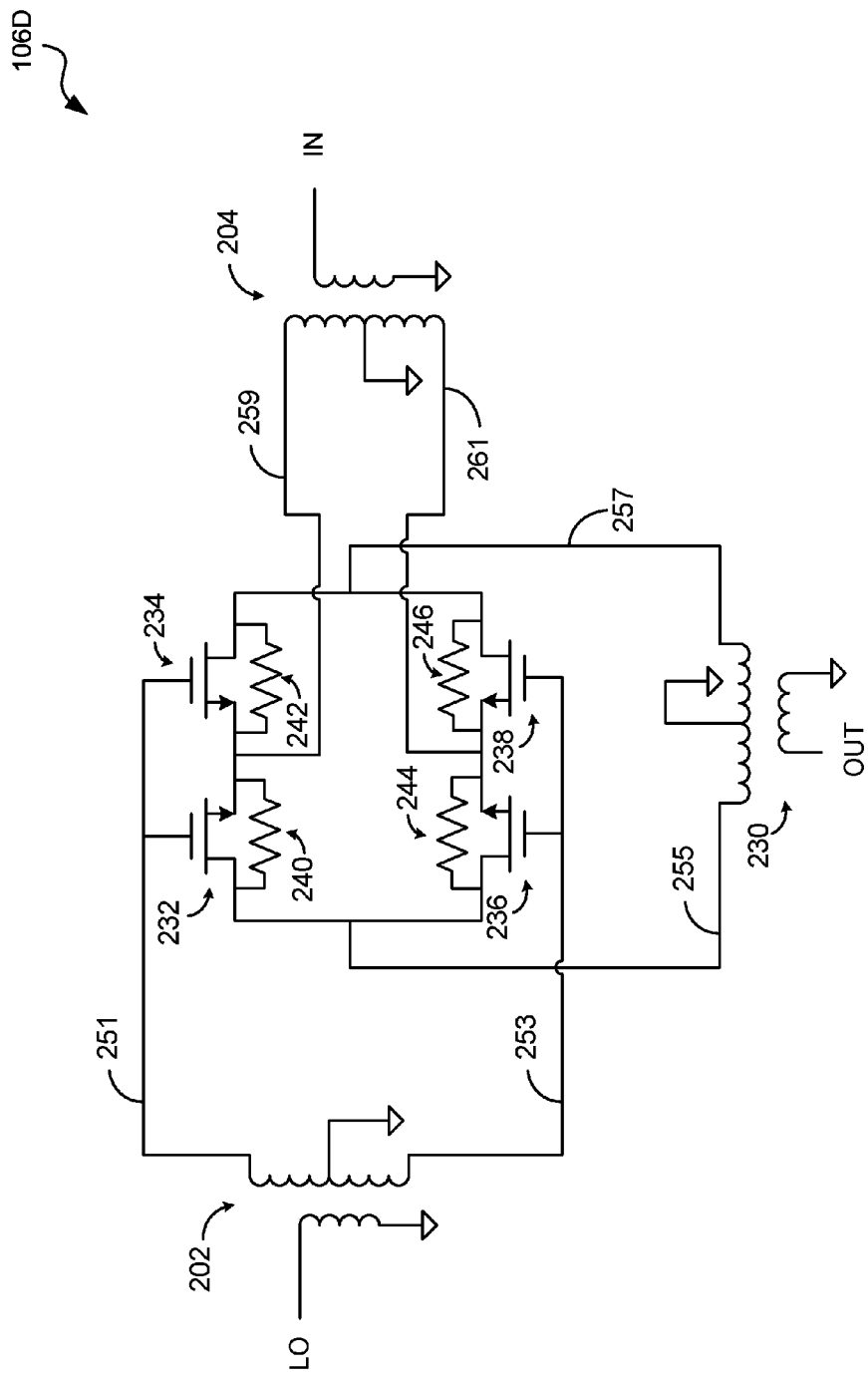
FIG. 2D is a diagram of a mixer according to another embodiment.

FIG. 2D is a diagram of a mixer according to another embodiment. The illustrated mixer 106D includes transistors 232, 234, 236, and 238 implementing switching circuit elements that form a ring. Shunt resistors 240, 242, 244, and 246 are respectively coupled to the transistors 232, 234, 236, and 238 between the source and the drain of the respective transistors 232, 234, 236, and 238. As illustrated in FIG. 2D, the gates of the transistors 232, 234, 236, and 238 of the mixer ring are coupled to the LO balun 202 at nodes 251, 253, and the mixer ring is coupled to the input signal balun 204 at nodes 259, 261 and an output signal balun 230 at nodes 255, 257.

Although the illustrated mixer 106D in FIG. 2D is implemented with NFET transistors, the mixer 106D can be any passive H-bridge ring mixer, quad FET mixer, or a FET ring mixer, or other suitable FET-based mixer, which can be implemented, for example, with NFET and/or PFET transistors. In a passive mixer, each transistor can operate as a switch that is either on or off. The transistors for a passive mixer can electrically connect two nodes when on and electrically isolate the two nodes when off. In a passive mixer, transistors can be periodically turned on and off to mix signals. A passive mixer can be in series with an active circuit and pass DC current of the active circuit. The differential LO signal from the LO balun 202 at the nodes 251, 253 can turn different transistors 232, 234, 236, and 238 of the mixer ring on and off. The mixer ring can alternatingly connect the differential input from the input signal balun 204 at the differential input nodes 259, 261 to the differential output nodes 255, 257 of the mixer ring. The output signal balun 230 converts or transforms the differential output signals at the nodes 255, 257 to produce the output signal, OUT, which is effectively the input signal, IN, multiplied by the LO signal, LO. It is to be noted that the mixer 106D can be partially or fully differential, receiving and/or producing differential input, LO, and/or output signals.

In the illustrated mixer 106D, the shunt resistors 240, 242, 244, and 246 that are coupled in parallel to signal path allows, for example, reduction in Q, or "de-Q"ing, of the off-state capacitance $C_{OFF}$ of the respective transistors 232, 234, 236, and 238. Similar to the mixers implemented with diodes, the mixer 106D includes the transistors 232, 234, 236, and 238 that are "de-Q"ed with the shunt resistors 240, 242, 244, and 246, which reduce resonance effects and improve linearity. The resistance of the shunt resistors 240, 242, 244, and 246 can be selected based on the trade-off between the conversion loss and improved linearity and other considerations, such as the sizing, $R_{ON}$, and/or $C_{OFF}$ of the transistors 232, 234, 236, and 238. The mixer 106D also operates based on similar principles and provides similar advantages, such as linearity, isolation, symmetry, and even order harmonics, discussed above in connection with the FIGS. 2A-2C.

Figure 3:
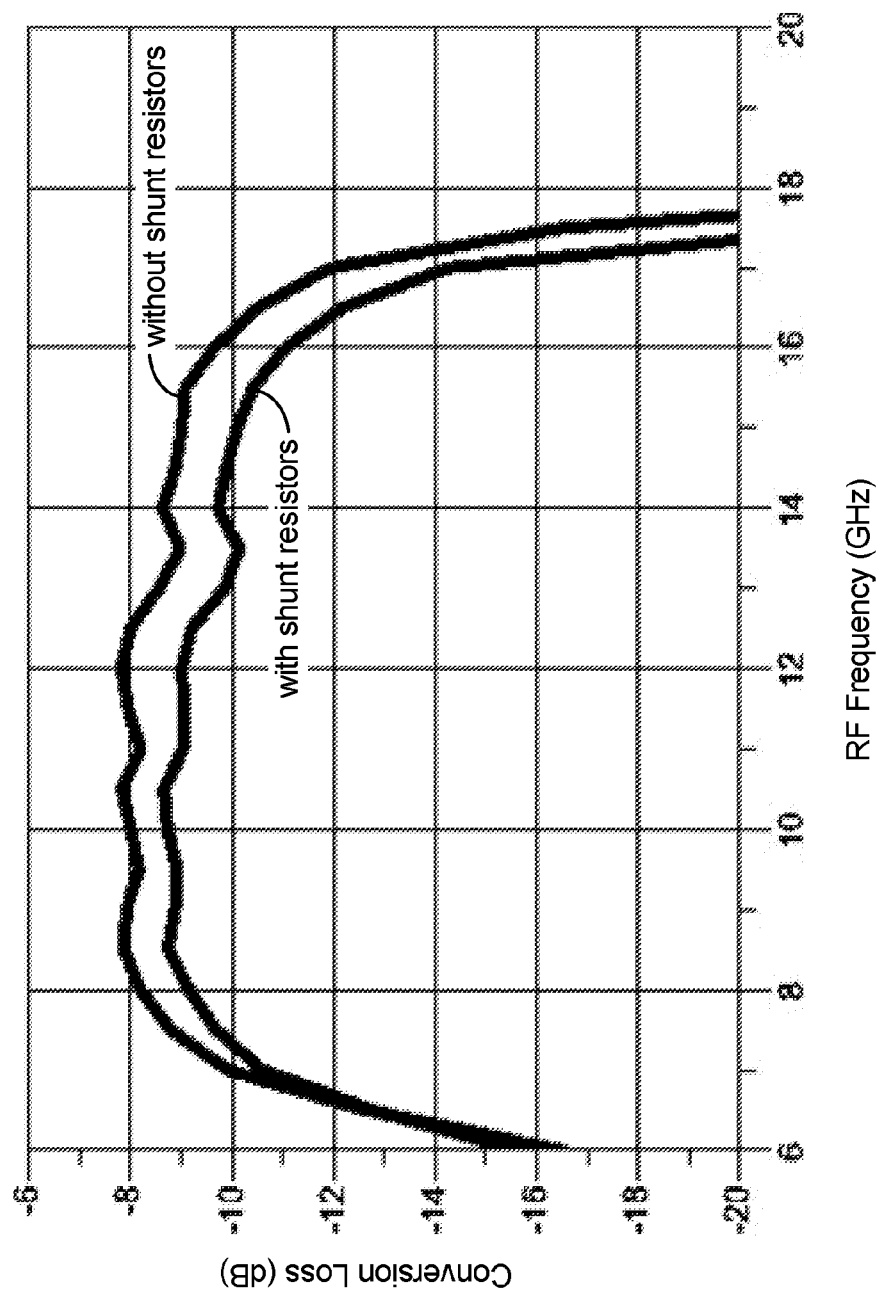
FIG. 3 is a measurement graph of an example mixer implemented according to principles and advantages the disclosed herein.

FIG. 3 is a measurement graph of an example mixer implemented according to the disclosed herein. The graph in FIG. 3 shows conversion loss over a range of RF signal frequency (from 6 GHz to 20 GHz). The example mixer in this particular case was implemented according to FIG. 2B with the shunt resistor value of about 1.8 kΩ where the IF was about 1.45 GHz and the LO range was from about 4.55 GHz to 18.55 GHz. In other examples, shunt resistor values can be chosen, for example, with respect to the diode or transistor "on" resistance. Shunt resistor values can be in a range from about 500Ω to 20 kΩ. In some applications, the shunt resistors can each have a resistance in a range from about 1 kΩ to 10 kΩ. The shunt resistors can be used in connection with any of the embodiments discussed herein and/or in accordance with the principles disclosed herein. As illustrated in FIG. 3, the mixer with improved linearity disclosed herein may result in more conversion loss compared to a mixer implemented without shunt resistors according to the trade-off between the conversion loss and improvement in linearity. In this simulation, the conversion gain is lowered by about 1 to 1.5 dB over the illustrated range of RF signal frequency.

Figure 4:
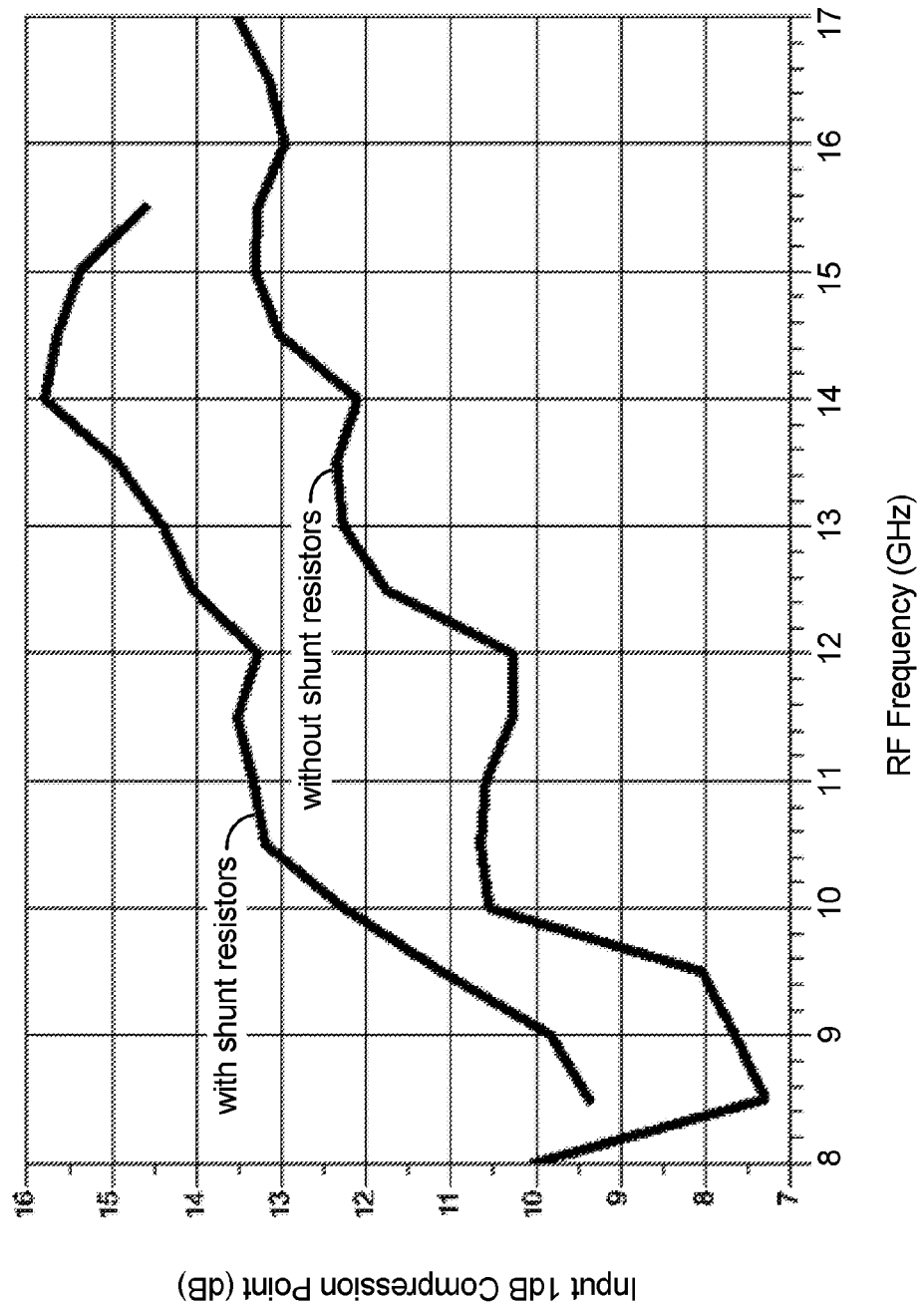
FIG. 4 is another measurement graph of the example mixer implemented according to principles and advantages disclosed herein.

FIG. 4 is another measurement graph of the example mixer as in FIG. 3. The graph FIG. 4 shows input 1 dB compression point ($P_{1dB}$), which as a measure of linearity indicates the input that causes the gain to decrease by 1 dB from the ideal linear gain, over a range of RF frequency (from 8 GHz to 17 GHz). The example mixer in this particular case was implemented according to FIG. 2B with the shunt resistor value of about 1.8 kΩ where the IF was about 1.45 GHz and the LO range was from about 4.55 GHz to 18.55 GHz. In other examples, shunt resistor values can be chosen, for example, with respect to the diode or transistor "on" resistance. Shunt resistor values can be in a range from about 500Ω to 20 kΩ. The shunt resistors can be used in connection with any of the embodiments discussed herein and/or according to the principles disclosed herein. As illustrated in FIG. 4, the mixer with improved linearity disclosed herein improves $P_{1dB}$ by about 3 dB over the illustrated range of RF signal frequency. The conversion loss simulation illustrated in FIG. 3 in conjunction with the input $P_{1dB}$ simulation in FIG. 4 demonstrate that the mixer implemented as disclosed herein greatly improves output $P_{1dB}$ (output linearity) that compensates for the increased conversion loss as compared to a mixer without shunt resistors. It is to be noted that the simulation measurements illustrated in FIGS. 3-4 are only a few sample metrics showing improved linearity of the mixers disclosed herein. Other performance measurements, such as input third-order intercept point (IIP3), output third-order intercept point (OIP3), etc. similarly indicate improvements and advantages of the disclosed herein. For instance, improvements in IIP3 and OIP3 by about 2-4 dB over a range of RF signal frequency (e.g., 9-15 GHz) of have been observed for mixers implemented as disclosed herein according to simulations.

Aspects of this disclosure can be implemented in various electronic devices. For instance, aspects of this disclosure can be implemented in any electronic device or electronic component that could benefit from a mixer with improved linearity. As an example, aspects of this disclosure can be implemented in any electronic device or electronic component with a transmitter, receiver, or transceiver that could benefit from a s mixer with improved linearity. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. A mixer comprising:
   switching circuit elements comprising a first switching element and a second switching element arranged in a ring; and
   shunt elements comprising a first shunt element and a second shunt element,
   wherein the first shunt element is coupled in parallel with the first switching circuit element and the second shunt element is coupled in parallel with the second switching circuit element,
   wherein the plurality of switching circuit elements are switched on and switched off based at least in part on a local oscillator signal received by the switching circuit elements, and
   wherein the mixer is configured to mix an input signal with the local oscillator signal to thereby frequency shift the input signal.

2. The mixer of claim 1, wherein the first shunt element is coupled between different baluns.

3. The mixer of claim 2, wherein the different baluns comprise a local oscillator (LO) balun and an input signal balun.

4. The mixer of claim 1, wherein the first shunt element is a shunt resistor.

5. The mixer of claim 1, wherein the switching circuit elements are diodes.

6. The mixer of claim 5, wherein the diodes comprise GaAs diodes.

7. The mixer of claim 1, wherein the plurality of switching circuit elements are field effect transistors (FETs), and wherein the first shunt element is coupled between a source and a drain of the first switching circuit element.

8. The mixer of claim 1, further comprising at least one series resistor coupled in series with the first switching circuit element in the ring.

9. The mixer of claim 1, further comprising at least one shunt element coupled between a differential local oscillator (LO) node and ground.

10. A mixer comprising:
    diodes comprising a first diode and a second diode; and
    linear circuit elements comprising a first linear element and a second linear element,
    wherein the first linear element is coupled in parallel with the first diode and the second linear element is coupled in parallel with the second diode,
    wherein the diodes are switched on and switched off based at least in part on a local oscillator signal received by the diodes, and
    wherein the mixer is configured to mix an input signal with the local oscillator signal to thereby frequency shift the input signal.

11. The mixer of claim 10, wherein the diodes are arranged in a ring.

12. The mixer of claim 10, wherein the first linear element causes the linearity of the first diode to be increased.

13. The mixer of claim 10, further comprising at least one series linear circuit element coupled in series with the first diode.

14. The mixer of claim 13, wherein the at least one series linear circuit element is a resistor.

15. The mixer of claim 10, wherein the first linear element is a shunt resistor.

16. The mixer of claim 10, further comprising at least one termination resistor coupled between a differential local oscillator (LO) node and ground.

17. The mixer of claim 10, wherein the diodes comprise a Schottky diode.

18. A mixer comprising:
    diodes arranged in a ring;
    resistors, each of which is arranged in parallel with a respective diode of the diodes arranged in the ring;
    a first balun configured to receive a local oscillator signal, the first balun being electrically coupled to a first node between two of the diodes arranged in the ring;
    a second balun configured to receive an input signal, the second balun being electrically coupled to a second node between one of the two diodes and another of the diodes arranged in the ring,
    wherein the mixer is configured to mix the input signal with the local oscillator signal to thereby frequency shift the input signal, and
    wherein the diodes arranged in the ring and the resistors are implemented on a single die.

19. The mixer of claim 18, wherein each of the resistors has a corresponding resistance in a range from 500Ω to 20 kΩ.

20. The mixer of claim 18, wherein at least one resistor is coupled between the first node and ground.

* * * * *